(12) United States Patent
Stack et al.

(10) Patent No.: US 9,022,608 B2
(45) Date of Patent: May 5, 2015

(54) UNLIT LED CIRCUIT BYPASS ELEMENT WITH SYSTEM AND METHOD THEREFOR (71) Applicant: Q Technology, Inc., Livermore, CA (US)

(72) Inventors: Thomas Stack, Oxford, MI (US); Ted Huff, Royal Oak, MI (US)

(73) Assignee: Q Technology, Inc., Livermore, CA (US)

( * ) Notice: Subject to any disclaimer, the term of this patent is extended or adjusted under 35 U.S.C. 154(b) by 117 days.

(21) Appl. No.: 13/658,799

(22) Filed: Oct. 23, 2012

(65) Prior Publication Data

US 2013/0043791 A1 Feb. 21, 2013

Related U.S. Application Data (63) Continuation-in-part of application No. 12/953,326, filed on Nov. 23, 2010, now abandoned.

(51) Int. Cl.
| | | |
|---|---|---|
| *F21V 21/00* | (2006.01) | |
| *G09F 13/22* | (2006.01) | |
| *H01L 25/16* | (2006.01) | |
| *H05B 33/08* | (2006.01) | |
| *F21S 4/00* | (2006.01) | |
| *F21V 19/00* | (2006.01) | |
| *F21W 131/305* | (2006.01) | |
| *F21W 131/405* | (2006.01) | |
| *F21Y 101/02* | (2006.01) | |
| *F21Y 105/00* | (2006.01) | |

(52) U.S. Cl.
CPC .............. *G09F 13/22* (2013.01); *H01L 25/167* (2013.01); *H05B 33/089* (2013.01); *F21S 4/003* (2013.01); *F21V 19/0045* (2013.01); *F21W 2131/305* (2013.01); *F21W 2131/405* (2013.01); *F21Y 2101/02* (2013.01); *F21Y 2105/003* (2013.01); *H01L 2224/48091* (2013.01); *H01L 2224/48247* (2013.01); *Y02B 20/341* (2013.01); *Y10S 362/80* (2013.01)

(58) Field of Classification Search
CPC ................ F21S 4/003; F21V 19/0045; F21W 2131/305; F21W 2131/405; F21Y 2101/02; F21Y 2105/003; G09F 13/22; H01L 25/167; H01L 2224/48091; H01L 2224/48247; H05B 33/089; Y02B 20/341
USPC ......... 315/122, 125; 362/249.02, 249.06, 800
See application file for complete search history.

(56) References Cited

U.S. PATENT DOCUMENTS

| | | | |
|---|---|---|---|
| 5,453,664 A | 9/1995 | Harris | |
| 6,054,716 A * | 4/2000 | Sonobe et al. | 257/99 |
| 6,580,182 B2 * | 6/2003 | Janning | 315/122 |
| 7,518,158 B2 | 4/2009 | Keller et al. | |
| 7,564,666 B2 | 7/2009 | Ball et al. | |

* cited by examiner

Primary Examiner — Stephen F Husar (57) ABSTRACT

A lighting system and protection means are disclosed. In particular, a Zener diode with pre-selected characteristics is used in parallel with an LED such that current will continue to flow through the circuit in case of LED failure. This adaptation in turn may be used in a series string combination.

11 Claims, 6 Drawing Sheets

UNLIT LED CIRCUIT BYPASS ELEMENT WITH SYSTEM AND METHOD THEREFOR

REFERENCE TO RELATED APPLICATIONS

This application is a Continuation in Part of a U.S. application Ser. No. 12/953,326, filed Nov. 23, 2010; which is a divisional of application Ser. No. 11/973,430, filed on Oct. 9, 2007, that issued as U.S. Pat. No. 7,862,195 on Jan. 4, 2011; which in turn claims the benefit of the filing date of U.S. Provisional Patent Application No. 60/850,030 filed Oct. 6, 2006, under 35 USC sections 119 and 120. The entirety of said application Ser. Nos. 12/953,326, 11/973,430, and 60/850,030, and U.S. Pat. No. 7,862,195, all entitled "Multiple Positioned Light Source to Achieve Uniform or Graded Illumination", are all incorporated by reference herein.

BACKGROUND

The present invention relates to lighting systems circuits. In particular, the present invention relates to circuitry to allow a lighting system to continue operation in case of failure of one or more of its light emitting elements.

The use of LED lighting technology is well known in the lighting art. However, rarely will one LED suffice to provide satisfactory illumination. As is common in the art, often multiple LEDs are electrically connected in series to provide illumination. However, the series arrangement is vulnerable to failure of one or more LED elements along the series string. If an LED fails so as to present a substantially higher resistance or open circuit, the remaining LED elements along the string will ordinarily cease to emit light.

Still, good reasons exist to place increased numbers of LEDs in series. For example, it may be advantageous to run a series circuit of many low current LEDs to reduce conductor cross-section. Additionally some power supplies may intrinsically produce high voltage output, requiring many LEDs in series to insure the individual voltage drop across each LED remains at a safe value. However, with increased numbers of LEDs in series, the possibility of at least one LED failure increases, thus posing a reliability risk.

One approach to minimize risk of light string failure due to just one failed LED or subset of failed LEDs along the string is to prevent LED damage through adding a protective element in parallel with each LED. For example, U.S. Pat. No. 6,054,716 issued to Sonobe et al on Apr. 25, 2000 discloses a parallel zener diode connected within an LED package to protect the LED from transient voltage.

Ideally, circuitry in parallel with a failed LED would allow current to flow through remaining LEDs despite the failed LED. The Sonobe patent discloses use of a zener diode to prevent LED failure but not to pass current around the LED in case of LED failure. Consequently in case of LED failure in Sonobe's circuit, there is no guarantee that any other LEDs connected in series with Sonobe's circuit would stay lit.

Accordingly, there remains a need for simple circuitry to economically sustain lighting system illumination in case of one or more LED failures along a series string.

SUMMARY

The need is met by the present invention. In a first embodiment of the present invention, a discrete zener diode with pre-selected characteristics is placed in parallel with a discrete LED. The pre-selected characteristics may include breakdown voltage, wattage, and current carrying capability. Optionally the zener may be selected with known behavior of becoming a temporary or permanent substantial short circuit in case of excess voltage drop or current flow. The risk of zener "failure" then becomes an advantage when the textbook "failure" mode is advantageous for this particular circuit operation.

In a yet another embodiment of the present invention, a light emitting diode package includes a light emitting diode and a zener diode with pre-selected characteristics. The light emitting diode is encased within a clear epoxy packaging material. The zener diode is placed within the epoxy packaging and connected electrically parallel to the light emitting diode. The light emitting diode package is preferably connected to two metal leads coming out of the epoxy packaging, and optionally to a base connector that may be plugged into a receptacle.

In a third embodiment of the present invention, a protected lighting circuit system includes one or more light emitting diodes placed in parallel with Zener diodes with pre-selected characteristics. The protected lighting circuit system may have an input circuit adapted to receive alternating current electrical power from an external source. For this option, a power converter circuit may be connected between the input circuit and to the light emitting diodes. The power converter is adapted to convert the input alternating current electrical power to direct current electrical power for consumption by the plurality of light emitting diodes.

In the protected lighting system, the power converter can include a power factor correction circuit. In the protected lighting system, a zener diode can be connected electrically parallel to each of the light emitting diodes.

Another embodiment of a lighting element with internal bypass capability, yet not requiring an AC to DC power converter is possible with use of AC LEDs and back to back Zener diodes. It is also possible to combine these elements into an integrated package, and to construct a lighting system using these elements. These elements may be built up into a lighting fixture for use in a commercial lighting application.

A productive use of these embodiments is the ability to light a series LED string that will continue to operate despite failure of one or more LEDs. Other productive uses will be apparent from reading the following detailed description.

BRIEF DESCRIPTION OF THE DRAWINGS

FIG. 5b shows a lighting element package containing the circuit elements in FIG. 5a;

DETAILED DESCRIPTION

The present invention will now be described with reference to the FIGS. 1 through 7 which illustrate various aspects, embodiments, or implementations of the present invention. In the Figures, some sizes of structures, portions, or elements may be exaggerated relative to sizes of other structures, portions, or elements for illustrative purposes and, thus, are provided to aid in the illustration and the disclosure of the present invention.

Figure 1:
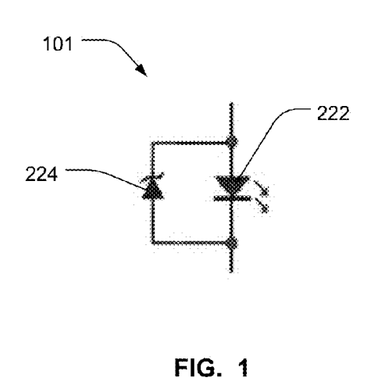
FIG. 1 is an electrical schematic representation of an LED with current bypass element in accordance with the present invention.

FIG. 1 illustrates one aspect of the present invention. According to the illustrated aspect of the present invention, in DC building block circuit 101 a parallel bypass element, here a zener diode 224 with pre-selected characteristics is connected electrically parallel with an LED 222 such that the cathode of the LED 222 is connected to the anode of the Zener 224 and vice versa.

In FIG. 1, the parallel Zener 224 is selected with sufficiently high breakdown voltage in order to not interfere with operation of the LED 222 while the LED is operational. The parallel Zener 224 is also selected for its current handling characteristics that will be discussed in conjunction with its use in a larger circuit.

Figure 2:
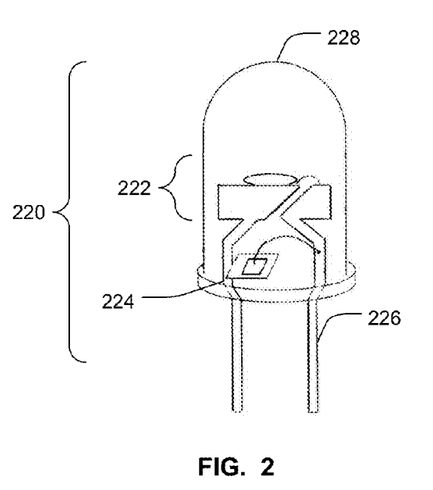
FIG. 2 illustrates a lighting element package containing the circuit elements in FIG. 1 in accordance with yet another aspect of the present invention.

FIG. 2 illustrates another aspect of the present invention. FIG. 2 is a physically integrated construct of the electrical schematic circuit shown in FIG. 1, contained within a light emitting diode package 220. In FIG. 2, the light emitting diode package 220 includes a light emitting diode 222 encased within a clear epoxy packaging material 228. Also encased within the epoxy packaging material 228 is a zener diode 224 that is also connected to the two metal leads 226.

In one embodiment, the light emitting diode 222 is connected to two metal leads 226 coming out of the epoxy packaging 228 for electrical connection and for heat spreading. Alternatively the light emitting diode 222 may be connected to a plug type configuration of separated electrical conductors routed with a rigid mechanical support that interlocks with a fixture. This would allow convenient replacement of light emitting diode package 220.

Referring back to FIGS. 1 and 2, as intended during normal operations, electrical power passes through the light emitting diode 222 causing the light emitting diode 222 to emit light. The light emitting diode 222 has a normal operating voltage range such as from 1.5 volts to 3.8 volts. The zener diode 224 is selected such that its reverse breakdown voltage is slightly above the upper limit of the normal operating voltage of the light emitting diode 222. In the present example, the zener diode 224 has a reverse breakdown voltage of approximately 4 volts. When the light emitting diode 222 fails causing the circuit to open, the voltage normally applied to the light emitting diode 222 is now applied to the zener diode 224. As the electrical current piles up at the zener diode 224, voltage across the zener diode 224 increases until zener diode 224 breaks down and begins to conduct. Accordingly, a failed light emitting diode does not prevent the flow of current that is needed in other components such as other light emitting diodes.

For example, if used with a type LW540A LED from Seoul Semiconductor, a type 1N4731A zener from Fairchild Semiconductor would be appropriate for this bypass purpose.

The placement of the pre-selected zener diode 224 inside the light emitting diode package 220 as shown in FIG. 2 is one possible embodiment of the present invention; however, this is not the only possible configuration under the present invention. For example, referring to FIG. 3, a protected lighting module 250 includes a plurality of light emitting diodes (LEDs) and power supply. In this case referring again to FIGS. 1 and 2 and continuing to refer to FIG. 3 in the integrated lighting system 250, a zener diode, such as the diode zener 224 in FIG. 1, can be connected electrically parallel to one or more of the light emitting diodes LD1 through LD41 of the series of light emitting diodes in dashed-box 254, with a fully populated set of zener diodes represented by the diodes ZN1 through ZN41 also in dashed-box 254. In this alternate embodiment, one or more zener diodes 224 can be placed outside one or more respective light emitting diodes 222 but mounted on a substrate such as a printed circuit board (PCB). Yet alternatively, the zener diodes may be placed within light emitting diode packages as in FIG. 2, assembly 220. These applications are still within the scope of the present invention, and it would even be possible to use some DC building block circuits 101 made of discrete parts placed in series with packaged combinations as in package 220.

Figure 3:
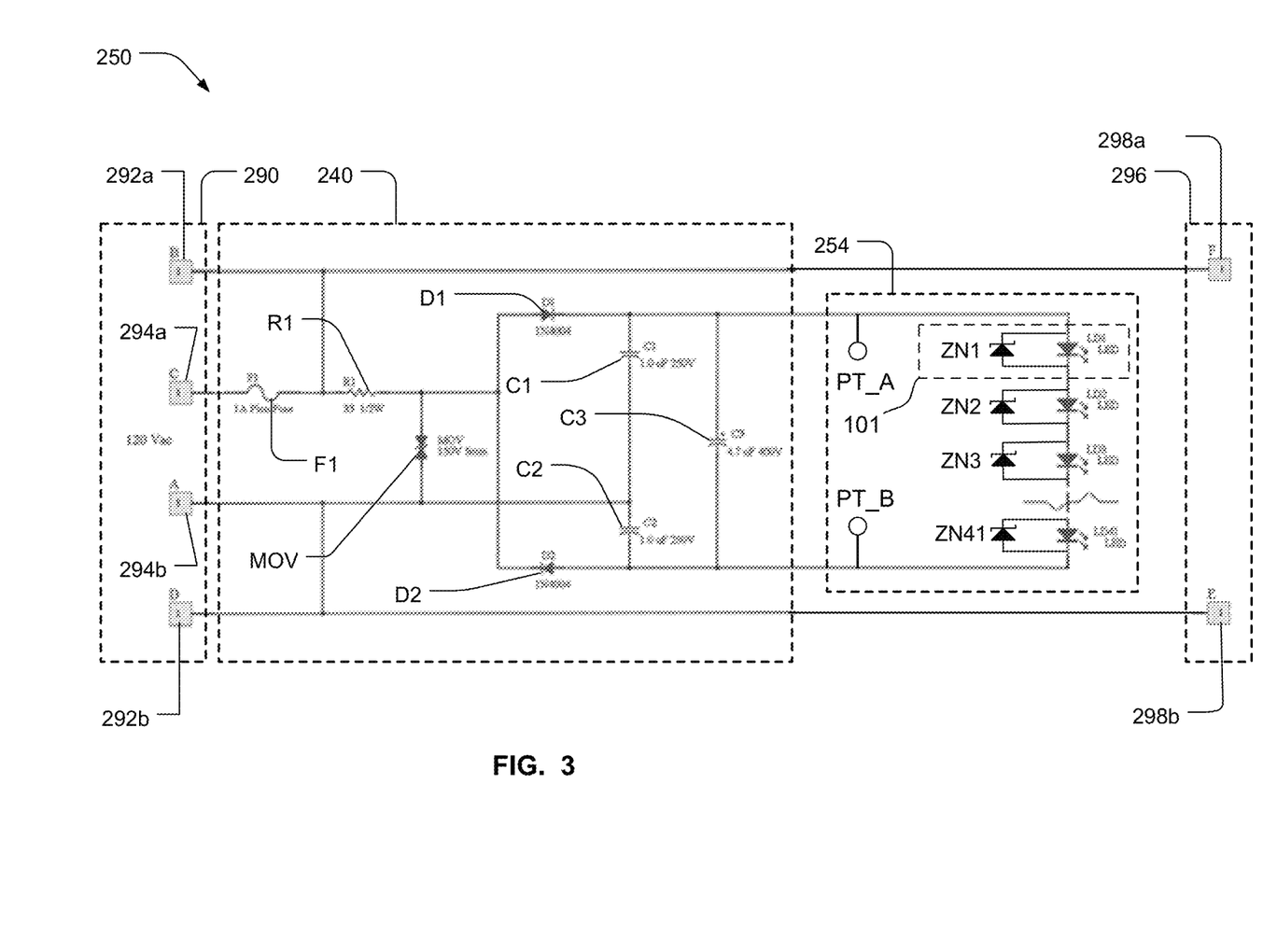
FIG. 3 is an electrical schematic representation of a protected lighting circuit in accordance with another aspect of the present invention, and that may be used within an integrated lighting module.

As yet another advantage, the circuit of FIG. 3 may be placed in an integrated lighting module. That is, all circuit elements may be contained within a single package without the need of an external power supply between the AC mains and the module.

The zener diode 224 is preferably selected with the capability of sustaining current flow at least substantially equal to that of an operational LED. In this case substantially equal would mean at least 80% of nominal LED current.

Figure 4A:
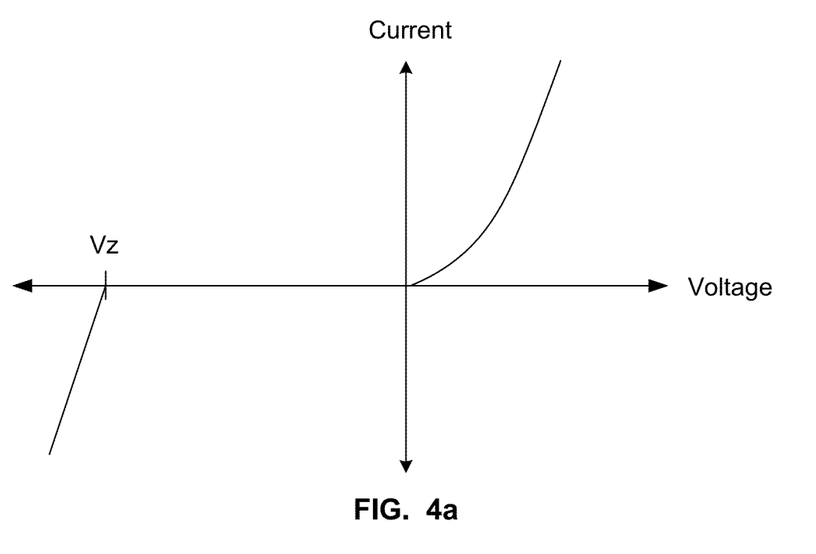
FIGS. 4a and 4b show voltage and current characteristics of practical LED circuit bypass elements.
Figure 4B:
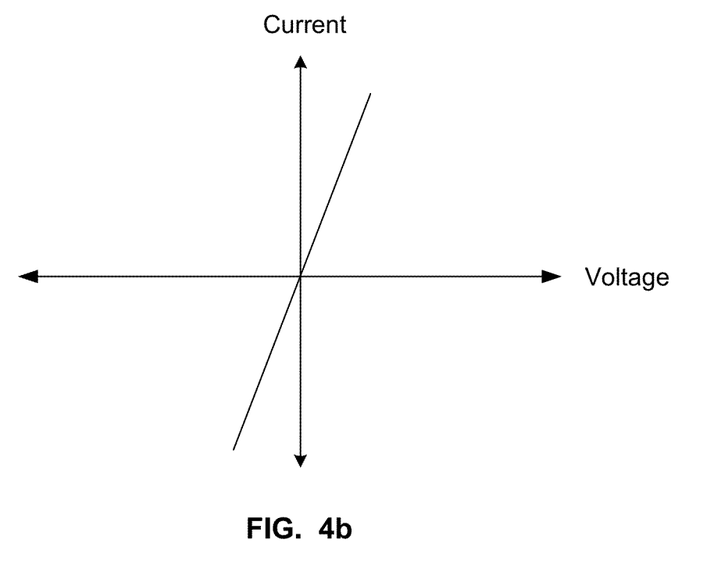

Referring to FIGS. 4a and 4b, it should be understood that the means by which the parallel bypass element 222 allows sustained current flow may occur in at least two different ways.

FIG. 4a illustrates possible electrical behavior of a component to be used as a current bypass element 224, in this case a zener diode. The right side of the graph 4a shows a characteristic behavior in that as the zener diode becomes forward biased, an approximately exponential current increase occurs with increasing voltage.

However, toward the left side of the graph 4a, as the applied voltage becomes negative, minimal device conduction occurs until the voltage Vz is reached, at which point the magnitude of diode current begins to increase, though with negative polarity corresponding to the negative voltage bias. In keeping to this behavior mode, there will be essentially no conduction through the zener diode when an LED operating at lower voltage is connected in reverse parallel with it, and voltage polarity is applied so as to light the LED.

Alternatively, the Zener 224 may "fail", that is to become substantially a short circuit if voltage across its terminals, or current flowing through its terminals exceeds rated limits, or its temperature rises above a critical level.

Referring now to FIG. 4b, a possible "ohmic" failure mode of the zener is shown. With this departure from the diode component's original behavior in 4a, significant conduction occurs with applied reverse voltage even at voltages below Vz. In this mode, the graph of the "ohmic" zener becomes essentially symmetrical about the origin, with current linearly proportional to voltage from zero to the current level of an operational LED. For the purpose of keeping an LED string lit, in this mode the zener that failed and shows "ohmic" characteristics is now effectively a short circuit across the failed LED.

In practice, it is not essential to know the exact shape of either curve in FIG. 4a or 4b, as long as the selected LED bypass element is essentially a nonconductor until voltage exceeds that applied across an operational LED.

Also the alternate current conduction modes in FIGS. 4a and 4b are shown for illustration purposes only to portray conduction profiles useful for failed LED bypass. The mechanism for the behavior change from FIG. 4a to FIG. 4b is speculated to occur due to partial melting of the semiconductor forming the zener. However, the change in component behavior is easily detectable with an ohmmeter. When compared to initial resistance readings that differ with polarity, the post-change resistance shows a considerable reduction in measured resistance, and with similar resistance irrespective of polarity.

The behavior of the Zener 224 may transition between textbook and short circuit "ohmic" modes during the course of its bypass function. It should be noted that most conventional applications use Zener diodes in textbook fashion, yet for this application a Zener short circuit "failure" in the textbook sense is actually beneficial for LED 222 bypass capability. Depending on the application, it may even be advantageous to select a zener 224 with high Vz relative to the nominal forward voltage of the LED 222 in parallel with it, so that in case of LED 222 failure, the product of voltage across and current through the zener 224 will result in power dissipation exceeding the zener 224 rated level, to induce the zener 224 to transition to the ohmic "failure" mode.

Preferably, the zener diode, whether operating in the textbook fashion of passing current while at or above its breakdown voltage Vz, or in a textbook "failure" mode of becoming essentially a short circuit (ie under 5 ohms resistance), will pass at least substantially as much current as did the failed LED that it bypasses. Again, "at least substantially" will be considered to be at least 80% of the nominal LED current.

However, though ideally the light output of an LED string based on elements 101 or 220 would match that of the circuit before the LED failure, in practice this is not essential. Fortunately, the human eye is capable of adapting to many light magnitude levels and is capable of visual perception at levels far lower than those intended for general illumination. Therefore in cases where some light is better than none at all, even the light from a dimly lit LED may still prove beneficial.

Consequently even in cases where the zener diode 524 does not pass as much current as a nominally operable LED, passing limited current could still prove useful. Even illumination produced by an LED string supplied with 10% or less of its nominal operating current may yet provide enough visibility to see one's way through an otherwise dark room, or serve other useful purposes.

Additionally, the guideline that the zener breakdown voltage Vz be slightly above the voltage range of an operational LED may be relaxed depending on the requirements of the application. For good results, a breakdown voltage slightly above that of an operational LED means that other LEDs along the series string will continue to have approximately the same voltage applied after an LED failure as before the failure. However, even a higher breakdown voltage would be useful in that, even if other LEDs along the string would receive less voltage after an LED failure, they could stay lit for the purpose of finding one's way through an otherwise dark room, or other useful purposes.

To further describe the lighting system environment in which the present invention may be employed, FIG. 3 also shows an electrical schematic representation of the example protected lighting circuit 250.

Referring to FIG. 3, the example lighting module 250 includes an input circuit 290. The input circuit 290 includes, for example, connection pads 294a and 294b adapted to connect to an external power source and adapted to receive alternating current electrical power from the external power source.

In the embodiment shown the external power source is 120 VAC; however, with changes in circuit component values in dashed-box 240, and addition or removal of diodes in series/parallel within dashed-box 254, other voltages may be supplied to the module. It should also be noted that the circuitry within dashed box 254 may be operated independently from the rest of the circuitry in lighting module 250; it would be possible to operate circuit 254 in isolation through supplying PT_A and PT_B with an arbitrary DC source of proper voltage to match the series string of LEDs.

The exemplary integrated lighting module 250 includes a power converter circuit 240 (also referred to as the "power supply") which may be mounted on the same support substrate as the LEDs and zeners in dashed-box 254 or separately. The power converter circuit 240 is connected to the input circuit 290 and connected to the series of light emitting diodes within dashed box 254. The power converter circuit 240 is adapted to convert the input alternating current electrical power to direct current electrical power for consumption by the plurality of light emitting diodes within dashed-box 254. In FIG. 3, within the protected lighting circuit 250 a series connected light emitting diode array is here represented by the diodes in dashed-box 254, though it should be understood that one or more parallel diode strings are possible.

In the power converter circuit 240, a fuse F1 provides current limiting (to prevent damaging sustained peak current) and a resistor R1 (to limit inrush current), as well as capacitors C1 and C2 (to limit steady state current). R1 could also be a negative temperature coefficient thermistor (NTC) to reduce energy loss after the initial current surge when the unit is energized. The power supply circuit 240 drives the light emitting diodes 254 in a series string configuration. Due to the current limiting components, the voltage at the supply output, at the connection points across C3, is reduced to a light emitting diode-safe drive level under load such as, for example, 132 volts. By use of capacitors C1 and C2 to limit incoming current, the disadvantages of heat dissipation in resistors or transistors are avoided. In case of no-load open circuit, capacitor C3 is rated above the nominal 340 Vdc produced by a voltage doubler circuit operating from a 120 Vac line, to avoid the possibility of component damage.

In the illustrated sample embodiment, the fuse F1 is a 1-amp Pico Fuse; the resistor R1 is a 24 ohm resistor rated at 1 watt; capacitors C1 and C2 have 1 microfarad 250 volt rating; capacitor C3 has 4.7 microfarad 400 volt rating; diodes D1 and D2 have 1N4004 rating 400 volt, 1 ampere; and the MOV (metal oxide varistor) has 150 volt rating, 5 mm lead spacing.

In an effort to provide high efficiency, low noise production, and low component count, a current limiting power supply utilizing non-dissipative capacitive reactance was selected. By using a full wave voltage doubler configuration, improved power factor over a bridge fed capacitor input filter supply can be realized. Resistor (R1) or NTC (negative temperature coefficient) thermistor provides for surge current limiting at the initial turn on and charging of C1, C2, and C3. An NTC (negative temperature coefficient) thermistor can be used in place of R1 since it has a high resistance at room temperature and turn on, but changes resistance to a lower value upon passing current and heating up. In that manner, dissipation losses are minimized after the unit is operating.

The MOV or metallic oxide varistor in conjunction with a series current limiting element (R1) provides transient voltage protection as found in some harsh industrial electrical environments. Components D1, D2, C1, C2, and C3 comprise a full wave voltage doubling power supply with the capacitance of C1 and C2 selected to provide capacitive reactance sufficient to limit the output current to that of the light emitting diode spec. C3 serves to reduce the ripple voltage appearing across C1 and C2 and thus reduces LED 120 Hz blinking. The inherent simplicity of this power supply circuit improves reliability.

In summary, the protected lighting module 250 includes a plurality of light emitting diodes (LEDs), zeners, and power supply. These applications are still within the scope of the present invention.

Figure 5A:
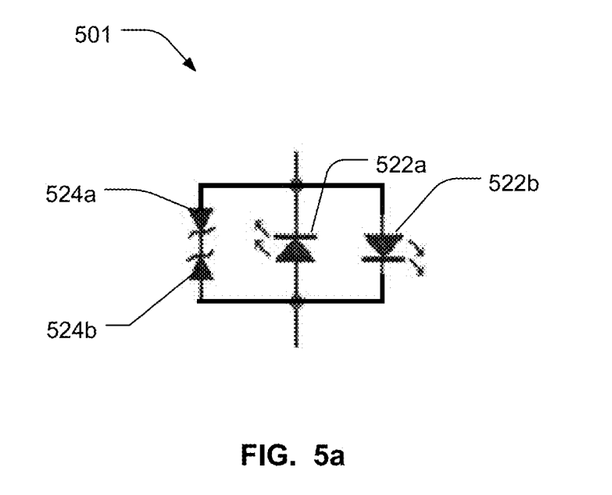
FIG. 5a shows a lighting element featuring a discrete AC LED and back to back discrete Zener diodes.

Alternatively, an AC building block circuit 501 of FIG. 5a may be constructed. FIG. 5a shows back to back zeners 524a and 524b having pre-selected characteristics, in parallel with LEDs 522a and 522b arranged in reverse parallel relation. This AC building block circuit 501 may be similarly employed to DC building block circuit 101, though of course in an AC circuit application.

In FIG. 5a, the parallel zeners 524a and 524b are selected with sufficiently high breakdown voltage so to not interfere with operation of the LEDs 522a and 522b while at least one LED is operational. The parallel zeners 524a and 524b are also selected for their current handling characteristics. Preferably the zeners 524a and 524b will be selected with the capability of sustaining current flow at least substantially equal to that of an operational LED. As with the DC zener bypass element 524, even a small amount of bypass current may suffice to keep remaining LEDs lit.

As with FIG. 1, in case of an open or high resistance LED failure, a Zener diode is advantageously placed so as to act as a current bypass element. In this case, zener 524a will serve a current bypass function in case of LED 522a failing open, and similarly, zener 524b will serve a current bypass function in case of LED 522b failure.

For example, if LEDs 522a and 522b are type LW540A from Seoul Semiconductor, zeners 524a and 524b of type 1N4731A from Fairchild Semiconductor would be appropriate for this bypass purpose.

Figure 5B:
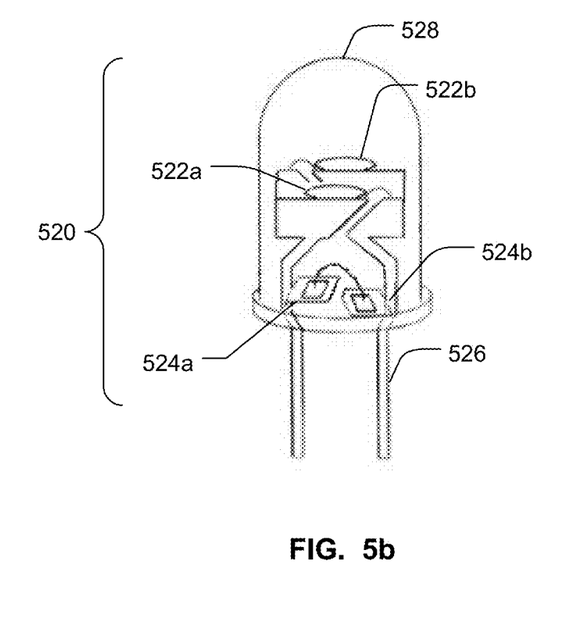

FIG. 5b illustrates another aspect of the present invention. FIG. 5b is a physically integrated construct of the electrical schematic circuit shown in FIG. 5a, contained within a light emitting diode package 520. In FIG. 5b, the light emitting diode package 520 includes light emitting diodes 522a and 522b encased within a clear epoxy packaging material 528. Also encased within the epoxy packaging material 528 are zener diodes 524a and 524b, of which each are also connected to the two metal leads 526.

In one embodiment, the light emitting diodes 522a and 522b are connected to two metal leads 526 coming out of the epoxy packaging 528 for electrical connection and for heat spreading. Alternatively the light emitting diodes 522a and 522b may be connected to a plug type configuration of separated electrical conductors routed with a rigid mechanical support that interlocks with a fixture. This would allow convenient replacement of light emitting diode package 520.

Referring back to FIGS. 5a and 5b, as intended during normal operations, electrical power passes through the light emitting diodes 522a and 522b causing them to emit light. However, as with FIGS. 1 and 2, the presence of the zeners with pre-selected characteristics means that a failed light emitting diode does not prevent the flow of current that is needed in other components such as other light emitting diodes.

Figure 6:
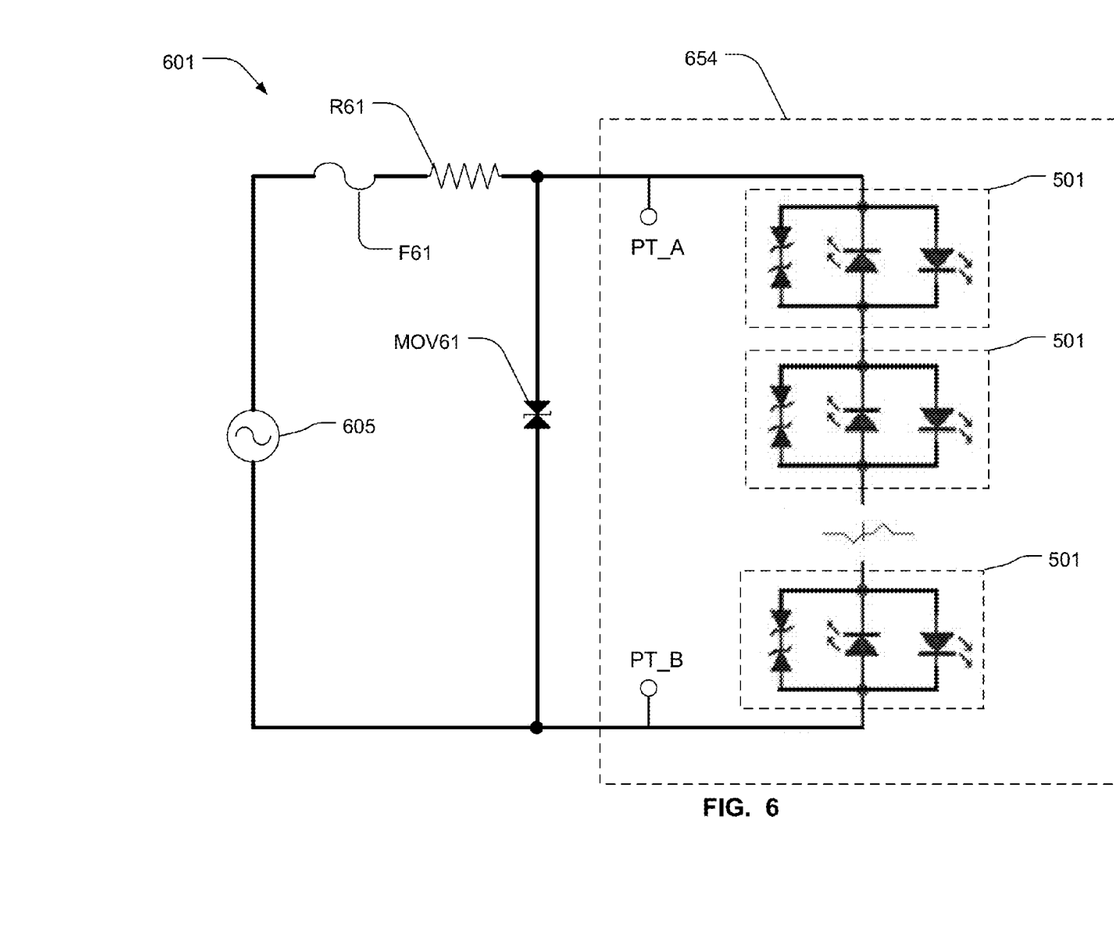
FIG. 6 shows a lighting system based on the circuit elements in FIG. 5.

The placement of the pre-selected zener diodes 524 inside the light emitting diode package 520 as shown in FIG. 5b is one possible embodiment of the present invention; however, this is not the only possible configuration under the present invention. For example, FIG. 6 shows an AC lighting system 601. Referring again to FIG. 5a and also referring to FIG. 6, a plurality of AC LED circuit elements 501 are series connected as building blocks 501 in series to each other connected and arranged in series with an AC power source 605 as shown in FIG. 6 to obtain AC lighting system 601. The lighting elements 501 may be made of discrete components 522 and 524, or packaged together as in FIG. 5b, assembly 520. These applications are still within the scope of the present invention.

As shown in FIG. 6, power source 605 supplies current to an arbitrary count series string of LED 501 assemblies. The voltage of power source 605 would be set up to match the number of LED 501 assemblies in the string. For example, if the voltage drop across an LED is 3 volts and there are 40 LEDs, then the voltage of power source 605 should be set to 120 volts.

Resistor R61, fuse F61 and MOV61 serve to protect the LEDs from harm in case of current or voltage spikes from the power supply. As is known in the art, appropriate values for these components may be readily calculated.

It should also be noted that the circuitry within dashed box 654 may be operated independently from the rest of the circuitry in lighting module 601; it would be possible to operate circuit 654 in isolation through supplying PT_A and PT_B with an arbitrary AC source of proper voltage to match the series string of light emitting diodes.

Figure 7A:
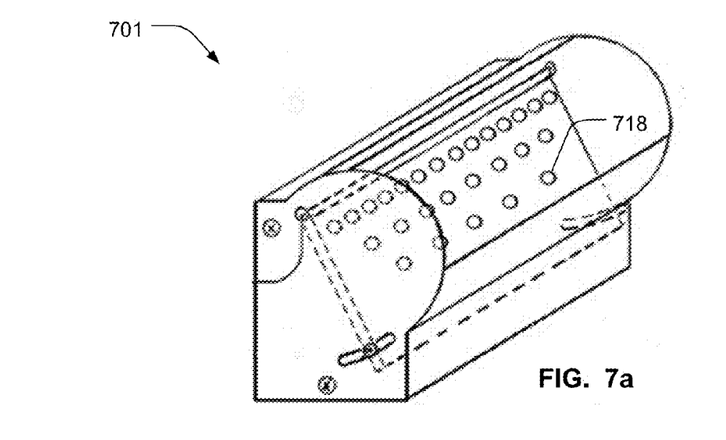
FIGS. 7a and 7b show lighting fixtures typical of which the LED circuit elements and lighting system may operate.
Figure 7B:
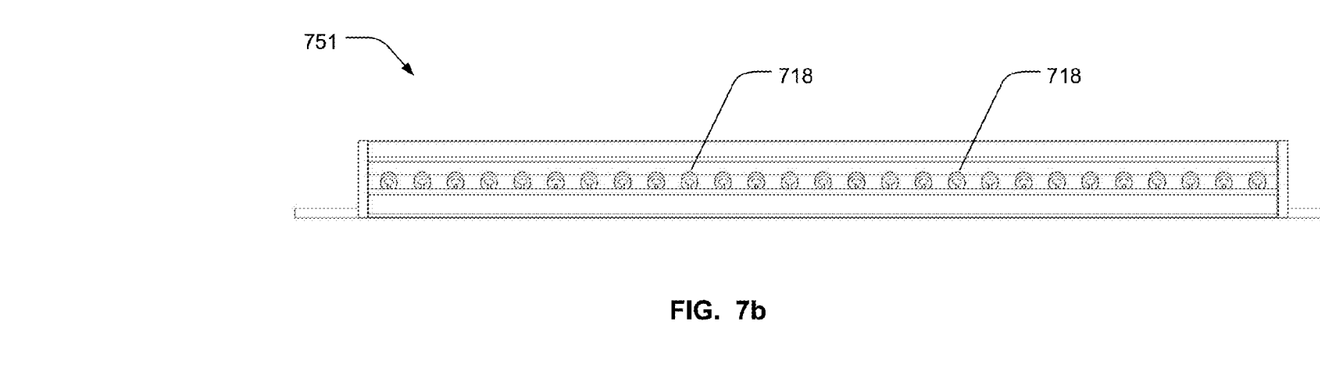

Referring to FIG. 7, several mechanical lighting fixture arrangements are shown in which the previously discussed zener bypass protected LED circuit embodiments may be deployed. FIG. 7a shows a lighting assembly 701 and FIG. 7b features a mechanical lighting fixture 751, each of which may be used to provide structural support for zener bypass protected LEDs 718. In this case, zener bypass protected LEDs 718 may be discrete LED elements 222 as in FIG. 1, schematic 101, each wired in parallel with a zener element 224. Alternatively LEDs 718 may be packaged DC LED elements 220 as in FIG. 2. Yet alternatively LEDs 718 may be built up from packaged AC LED elements 520 as in FIG. 5b, package 520, or discrete LED elements 522a and 522b in parallel with discrete zener elements as in FIG. 5a, schematic 501. As can be seen in FIGS. 7a and 7b, the zener bypass protected LEDs may be arranged in multiple lines with varying spacing or single file with constant spacing. Other physical arrangements comprising zener bypass protected LEDs 718, including some made of various combinations of discrete DC or AC building blocks 101 or 501, along with packaged DC or AC LEDs 220 and 520 are possible and yet within the scope of the invention.

From the foregoing, it will be appreciated that the present invention is novel and offers advantages over the current art. Although several specific embodiments of the invention are described and illustrated above, the invention is not to be limited to the specific forms or arrangements of parts so described and illustrated. For example, differing configurations, sizes, or materials may be used to practice the present invention. The invention is limited by the claims that follow.

What is claimed is:

1. A lighting system circuit adapted for connection to a DC power source, comprising:
   a plurality of building blocks, each building block having an LED connected in reverse parallel fashion with a zener diode;
   said building blocks connected in series circuit fashion to each other;
   and
   wherein each zener diode has a breakdown voltage that allows to sustain current flow even upon failure of the LED to which is it connected in reverse parallel.

2. A lighting system circuit as in claim 1,
   wherein each zener diode has the capability to sustain current flow at least substantially equal to that of an operational LED.

3. A lighting system circuit as in claim 1,
wherein each zener diode is capable of transforming to a permanent or temporary substantial short circuit under conditions of excess temperature, voltage, or current.

4. A light emitting diode element comprising;
two light emitting diodes connected in reverse parallel;
two zener diodes connected in series with each other, and in parallel with said light emitting diodes;
wherein the zener diodes have a breakdown voltage that allows operation of said light emitting diodes and being capable of sustaining current flow at a level that is substantially equal to that of an operational LED.

5. The light emitting diode element recited in claim 4,
wherein said light emitting diodes and said zener diodes are contained within a light transmissive package.

6. A lighting system circuit adapted for connection to an AC power source, comprising:
a plurality of building blocks, the circuit building blocks having light emitting diodes connected in reverse parallel fashion, and also connected electrically in parallel, two zener diodes in series fashion;
said circuit building blocks connected in series circuit fashion;
and
wherein each zener diode has a breakdown voltage that allows normal operation of said light emitting diodes, and capability to sustain current flow sufficient to at least partially light an LED.

7. A lighting system circuit as in claim 6,
wherein each zener diode has the capability to sustain current flow at least substantially equal to that of an operational LED.

8. A lighting system circuit as in claim 6,
wherein each zener diode is also selected for breakdown voltage slightly above that of an operational LED.

9. A method of allowing functional LEDs in an LED series string to light despite at least one failed LED, comprising:
placing at least one zener diode in reverse parallel connection across at least one LED in the series string,
wherein each placed zener diode is selected with a breakdown voltage that allows operation of said light emitting diodes, and capability to sustain current flow sufficient to at least partially light at least one LED.

10. A method of allowing functional LEDs in an LED series string to light despite at least one failed LED as in claim 9,
wherein each zener diode is also selected for the capability of sustaining current flow at a level at least substantially equal to that of an operational LED.

11. A method of allowing functional LEDs in an LED series string to light despite at least one failed LED as in claim 9,
wherein each zener diode is also selected for breakdown voltage slightly above that of an operational LED.

\* \* \* \* \*